United States Patent [19]

Kaplan

[11] Patent Number: 4,517,918
[45] Date of Patent: * May 21, 1985

[54] CRYSTAL PLATING CHAMBER APPARATUS

[75] Inventor: Alan Kaplan, W. Caldwell, N.J.

[73] Assignee: Emkay Manufacturing Co., East Hanover, N.J.

[*] Notice: The portion of the term of this patent subsequent to Dec. 2, 1997 has been disclaimed.

[21] Appl. No.: 394,338

[22] Filed: Jul. 1, 1982

Related U.S. Application Data

[63] Continuation-in-part of Ser. No. 369,401, Apr. 19, 1982, Pat. No. 4,419,379, and Ser. No. 194,078, Oct. 6, 1980, Pat. No. 4,367,579, which is a continuation of Ser. No. 034,780, Apr. 30, 1979, Pat. No. 4,236,487, said Ser. No. 369,401, is a continuation of Ser. No. 193,935, Oct. 6, 1980, abandoned.

[51] Int. Cl.³ .............................................. C23C 13/12
[52] U.S. Cl. ..................................... 118/723; 118/726; 118/728; 118/712; 29/25.35; 310/312; 324/56
[58] Field of Search ............... 118/500, 503, 504, 712, 118/720, 721, 723, 726, 728; 29/25.35; 310/312, 340, 348; 324/56; 427/10, 100

[56] References Cited

U.S. PATENT DOCUMENTS 2,765,765 10/1956 Bigler et al. .................... 427/100 X
4,236,487 12/1980 Kaplan ................................ 118/723

OTHER PUBLICATIONS

Holland, "Vacuum Deposition of Thin Films", John Wiley & Sons Inc., New York, 1956, pp. 114 to 120.

Primary Examiner—John D. Smith
Assistant Examiner—Bernard F. Plantz
Attorney, Agent, or Firm—Edward R. Weingram

[57] ABSTRACT

An improved crystal plating device having a base containing a power circuit and an oscillating circuit. The base is provided with a chamber and has a sealed top enclosing the chamber. At least one pair of filament posts are fixed to the base and disposed within the chamber and in the power circuit. A filament is connected across the filament posts. A crystal holder is removably connected with the base. The crystal is held by the holder in the oscillating circuit. A pump is connected to the base to vacuum pump the chamber. Energizing the circuits will oscillate the crystal and evaporate the filament to plate the crystal and produce the desired frequency therefore.

Filament posts each comprising a hollow body having an insulating sleeve thereon are threadedly received on a member affixed to the base. A slot is provided in the body near the upper end with a spring biased pivotable lever, the filament being disposed within the slot. Pivoting the lever of the filament post sideways will permit engagement of the filament in the slot upon release of the lever.

9 Claims, 8 Drawing Figures

CRYSTAL PLATING CHAMBER APPARATUS

RELATED APPLICATIONS

This application is a continuation-in-part application of U.S. Ser. No. 194,078, filed on Oct. 6, 1980, now U.S. Pat. No. 4,367,579, which is a continuation of U.S. Ser. No. 034,780 filed Apr. 30, 1979, now U.S. Pat. No. 4,236,487. This application is also a continuation-in-part of U.S. Ser. No. 369,401, filed Apr. 19, 1982, now U.S. Pat. No. 4,419,379, which is a continuation of U.S. Ser. No. 193,935, filed Oct. 6, 1980, now abandoned, which is a continuation of U.S. Ser. No. 034,780, now U.S. Pat. No. 4,236,487.

This application is also related to U.S. Pat. No. 4,323,031 which issued on a divisional application to U.S. Ser. No. 034,780, now U.S. Pat. No. 4,236,487. The entire disclosures of all of the aforementioned applications and patents are incorporated herein by reference.

BACKGROUND OF THE INVENTION

1. Field of the Invention

This invention relates to an improved apparatus for the plating of material, and more particularly to the vacuum plating of crystals in a circuit board.

2. Description of the Prior Art

Crystals can be made to oscillate at a natural frequency, or by appropriate and selective plating, can be manufactured to oscillate at a desired exact frequency. With the increased importance of electronics in our daily lives, crystals have gained widespread use, particularly in the form of circuit boards, often used as clock oscillators.

Depending upon how exacting the frequency is to be set, for plating of clock oscillator crystals, the user will base coat the crystal to a rough frequency, mount it on an oscillator circuit board, and finally callibrate the completed circuit by means of plating additional material on the crystal to tune the entire circuit as a whole.

In other plating operations, individual crystals can be plated in the apparatus. In those cases the crystal may be first base plated on one side, or both sides before final plating, again on one or both sides. In the more accurate frequency work it is recommended to coat both sides of the crystal to avoid "spurs" which is the occurrence of random peaks caused by aberrations of unknown origin.

In the frequency range of the present invention, the fundamentals and overtones thereof have been tested to 200 Mega Hertz (MHz) and above and have tested out with great accuracy of 2 ppm up to frequencies of at least 180 MHz.

Prior to the invention of U.S. Pat. Nos. 4,236,487 and 4,323,031 to Kaplan, of which this invention is an improvement thereon vacuum crystal plating was done in a bell jar in which the crystal had to be internally loaded with tweezers into a special holder within the bell jar. The entire bell jar was evacuated including the special holder for the crystal. The vacuum was drawn through a narrow opening in the jar. The vacuum was not as absolute as desired. The relative size of the vacuum equipment, the complexly shaped items that were within the vacuum chamber, and multiple insulated wires disposed inside the vacuum chamber, provided multiple surfaces to which air or other contaminants could adhere. The presence of these contaminants, together with the difficulties in removing them resulted in deficiencies in the plating process and resulted in deficiencies in the product produced.

Additionally, the internal loading of the crystals within the bell jar was relatively time consuming and, therefore, expensive. Also, because of the size and shape of the vacuum equipment, much of the noble metal vaporized in the plating process never reached the crystals to be coated. Instead the metal was randomly deposited on the walls of the jar or surfaces of the crystal holder. Therefore, the plating process was lengthened and much of the metal used in the plating process was ineffectively used.

Additionally, the random depositing of conductive material within the chamber produced shorting or other electrical conduction problems. Further, the random depositing of the precious metals on the vacuum sealing surfaces such as "O" rings and mating surfaces caused deterioration of these surfaces and therefore, resulted in vacuum leaks.

The randomly deposited noble metal was recovered by cleaning the surfaces within the bell jar. However, because of the complexly shaped and relatively large surfaces the cleaning process was not as quick or easy as desired. Such apparatus as these are exemplified by U.S. Pat. No. 2,765,765 to Bigler et al, U.S. Pat. No. 3,756,851 to Rennick et al, U.S. Pat. No. 3,864,161 to Thompson, and and U.S. Pat. No. 4,112,134 to Buynak et al.

To overcome most of these prior art problems, the aforementioned invention of Kaplan was produced. Kaplan's device provided a crystal plating device which reduced the vacuum pumping time due to its relatively small vacuum chamber, enabled alignment of the crystal to be plated to be made externally of the vacuum chamber thus reducing the extent of alignment of the crystal within the vacuum chamber, provided a plating device which was relatively easy to clean, minimized the amount of time required for loading of the chamber, facilitated effective use of the noble metal, and had many numerous other advantages.

Often, however, it is desirable to plate crystals after they have been placed in a circuit on a circuit board. The aforementioned Kaplan's described device was incapable of accomplishing this without modifications that were relatively impractical. Additionally, filaments have been developed which were essentially a conductive filament strip having a plurality of areas of noble metal attached to the strip. The filament holder described in Kaplan was cumbersome to use with such type filament.

SUMMARY OF THE INVENTION

To overcome the aforementioned problems, the present invention directed primarily to an improved device for plating crystals was developed. As indicated previously, this is an improvement on the invention described and/or claimed in U.S. Pat. No. 4,236,487 to Kaplan, the entire discloseure of which is incorporated herein by reference. Broadly, the invention comprises an improved crystal plating device having:

a base having a power circuit and means for an oscillating circuit therein;
a chamber formed in the base;
a sealed top enclosing the chamber;
at least one pair of filament posts fixed to the base disposed within the chamber and in the power circuit;
a filament connected across the filament post;

a crystal holder removably connected with the base; and a crystal in the oscillating circuit and carried by the crystal holder;

the base adapted to be connected to a pump to vacuum pump the chamber so that energizing the circuits will oscillate the crystal and evaporate the filament to plate the crystal and produce the desired frequency therefore: the improvement comprises: an improved crystal holder which can accommodate a crystal in a plug-in circuit board having a plurality of circuit connecting prongs, and the crystal holder including a plug-in means for inserting the prongs of the circuit board in the oscillating circuit.

Additionally or alternatively, the improvement comprises a filament post having a hollow body and an insulating sleeve thereon, the body being threadedly reecived on a member affixed to the base, a slot in the body near the upper end, and a pivotable lever, adjustably spring biassed, the filament disposed within the slot, whereby pressing the lever sideways will permit engagement of the filament in the slot upon release of the lever.

Accordingly, it is an object of the present invention to provide an improved crystal plating device which can securely and conveniently hold a circuit board therein.

It is another object of the present invention to provide a device which enables alignment of the crystal in the cicuit board to be plated to be made external of the vacuum chamber.

It is another object of the present invention to provide a crystal plating device which can plate the crystal in a circuit board.

Another object of the present invention is to provide a crystal plating device for crystals in a ciruit board which minimizes the amount of time required for loading the circuit board in the chamber.

Still another object of the present invention is to provide a crystal plating device which enables easy and rapid replacement of filament having thereon plating materials which are used for vaporizing.

Yet another object of the present invention is to provide an improved crystal plating device which extends the useful service life of the filaments used while also maintaining superior electrical contact with the filaments.

It is a further object of the present invention to provide a crystal plating device which can plate crystals in circuit boards of different sizes.

It is an additional object of the present invention to provide a crystal plating device that does not require modification of the chamber to vary the size of the circuit board on which the crystal is incorporated and which is being plated in the chamber.

It is an additional object of the present invention to provide a method for plating crystals in a circuit board which enables alignment of the crystals simply and without need of special tools.

Other objects and advantages will be apparent from the following detailed description of the invention.

BRIEF DESCRIPTION OF THE DRAWINGS

The invention is illustrated in the accompanying drawing in which.

DESCRIPTION OF THE PREFERRED EMBODIMENT

The present invention as illustrated in FIGS. 1 through 8 show an improved crystal plating apparatus in which a circuit board (20) having a crystal to be plated.

Figure 1:
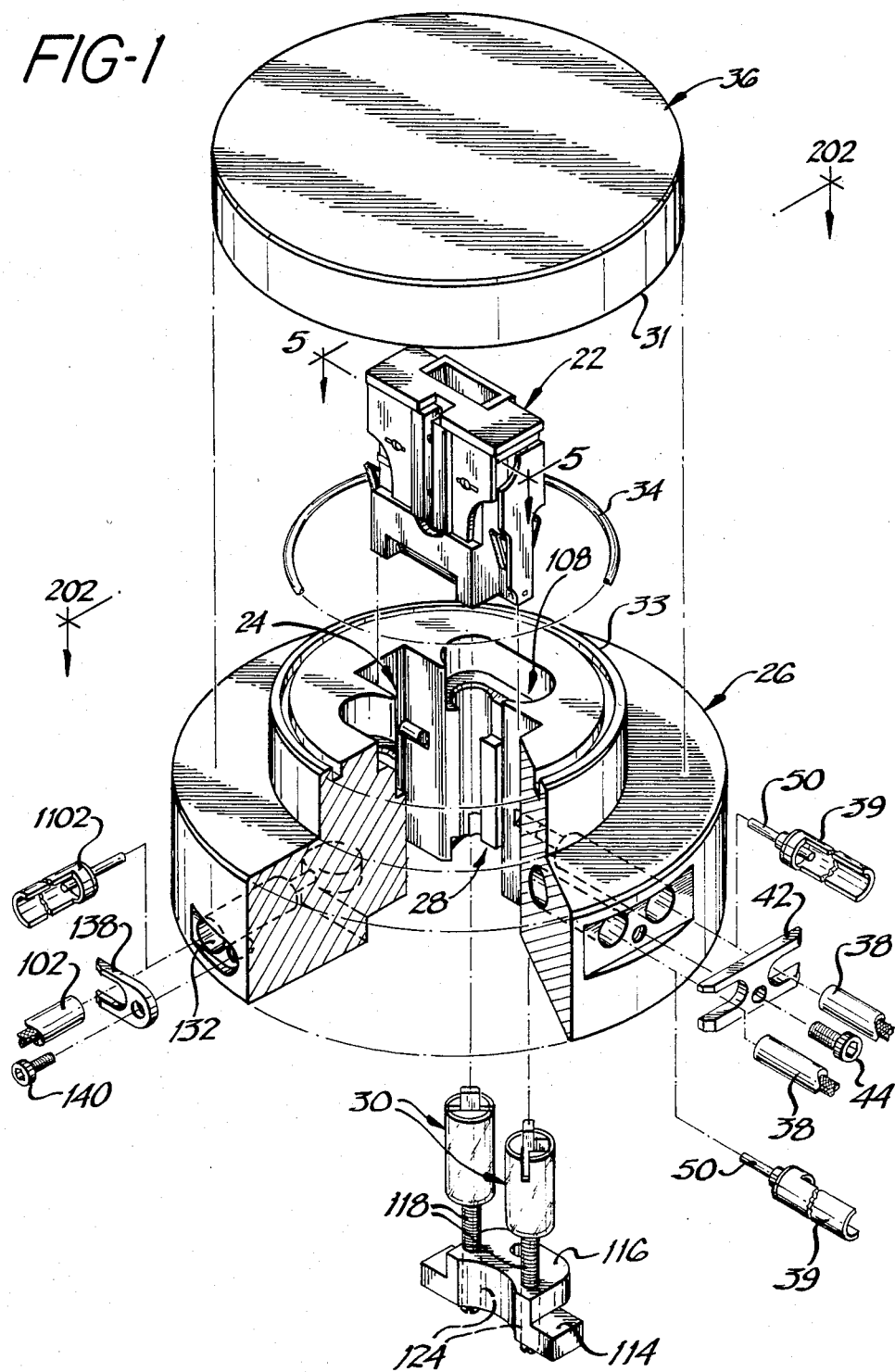
FIG. 1 is an exploded perspective view of the crystal plating apparatus of the present invention.
Figure 7:
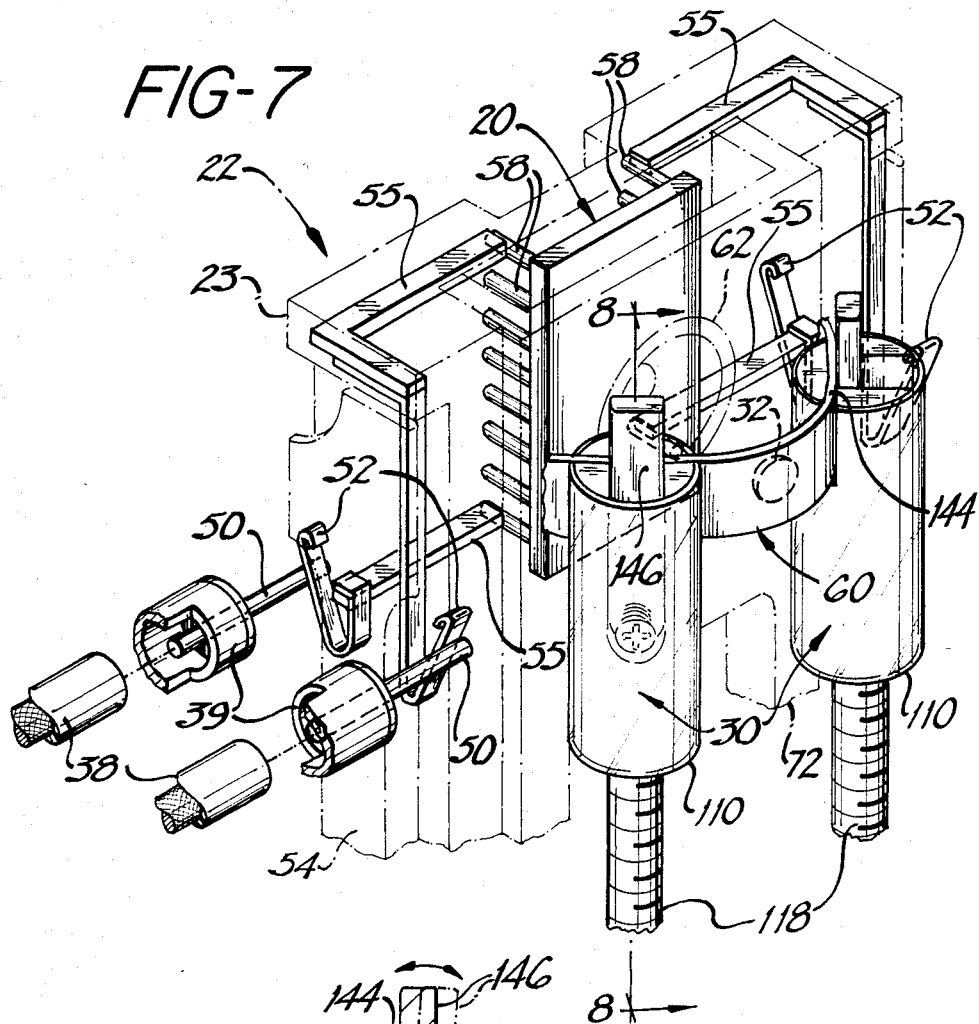
FIG. 7 is a perspective view of the holder and filament posts ready for use.

Referring to FIGS. 1 and 7, the circuit board (20) is plug connected within a holder (22) which when in its closed position is inserted into a slot (24) of a base (26) in communication with a chamber (28) in which is disposed a pair of filament posts (30) on one side of the circuit board (20). Across posts (30) is mounted a filament (60) having thereon gold or silver areas (32).

Referring to FIG. 1, base (26) is connected at the open bottom of the chamber (28) via the manifold to a suitable pump (not shown) which may have a control valve. The top (33) of the base (26) has an annular "O" ring (34) which will seal against the top cover (36). The cover (36) has a rim (31) which fits about the circular top (33) to snugly seal the top when a vacuum is applied to the chamber (28). The vacuum pumping time is relatively short due to a low volume chamber and the use of a wide mouth opening at the bottom of the chamber (28).

Figure 3:
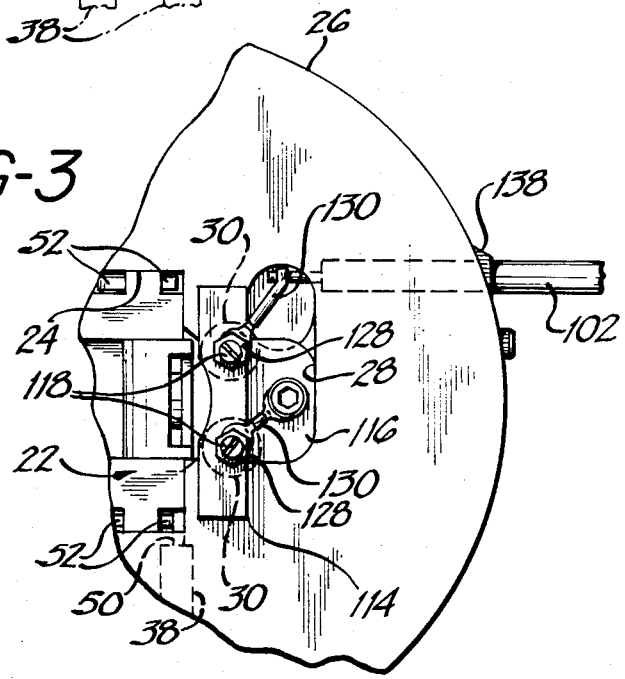
FIG. 3 is an enlarged bottom plan view of a filament post power connection.

Referring to FIGS. 1, 3, and 7, two separate and independent circuits are run within the base (26). Referring to FIG. 1, circuit is made by a pair of shielded wires (38) which are grounded at the base (26) at the wire feed-through retainer plate (42) connected to the base (26) by a fastener (44). As shown in FIG. 7, each wire extends insulatingly through the base (26). The inner end of each wire (38) connects to a lead pin (50) which extends partially into the slot (24) near its bottom. There are two pair of shielded wires (38) connected to glass to metal seals (39) in feed throughs into the vacuum system permitting various optional contact arrangements.

Referring to FIG. 7, the holder (22) has a contact surface (52) disposed on each side of an insulated block (54) Prongs (58) from the circuit board (20) containing the crystal are fitted into receptacles (56) in the block (54). The leads (55) contact the appropriate prongs in the circuit board to maintain a circuit through the crystal which is in the circuit board (20). When the circuit board (20) is mounted in the insulated block in circuit with leads (55), a series circuit will be formed running from wires (38) to pin (50), to contact surface (52), lead (55), and prongs (58) through the crystal, and then out the other side wherein the components appear in reverse order.

For plating only crystals, The wires (38, 38) are connected to an external frequency oscillator (not shown) which incorporates the crystal in the oscillating circuit.

When plating crystals on circuit boards (20), the circuit board and crystal often form a clock oscillator circuit. Since the circuit board (20) contains the oscillator, all that is necessary is to connect the circuit via wires (38) to an external frequency counter (not shown). Any Other of the wires (38), (38) can be used to supply the power to the oscillator in the circuit board (20). The oscillator with the crystal is connected to a frequency counter which monitors the changes in frequency as the plating proceeds. It will be understood that any conventional oscillation circuit and oscillator can be used in order to achieve the improvement of the present invention, and therefore, no specific details thereof have been set forth herein.

Referring to FIGS. 1, 3, and 7, the second circuit is the power circuit. The power circuit is connected to a suitable power supply (not shown) to which the conductive filaments (60) are attached as shown. FIG. 7 is attached across adjacent filament posts (30), and the posts (30) are connected in series with the last post grounded to the base (26) to complete the power circuit. Upon energizing the power circuit, a current of about 30 amps and 5 volts is passed through the circuit and the filaments (60) so as to vaporize the silver or gold or any other metal or other substance that is sought to be vaporized (32) thereon. These areas (32) are adjacent to the crystal in the circuit board (20) and will be directed through the mask (62) (see FIG. 4) mounted in the holder (22) to be deposited upon the crystal in the circuit board (20) so as to plate the crystal. Because the current is high and the voltage low, the only element that gets hot is the high resistance filament (60) and the areas (32) of silver or gold or any other metal or other substance that is sought to be vaporized thereon. The filament posts (30) are of much larger mass than the filaments (60) and will act as heat sinks to greatly reduce cycle time. The heat drawn into the filament posts, will in turn be dissipated by the relatively massive solid body of the chamber. The effectiveness of the heat sink will immediately cool the filament and stop the plating process, thereby reducing excess depositing of material which results in "overshoot".

Figure 4:
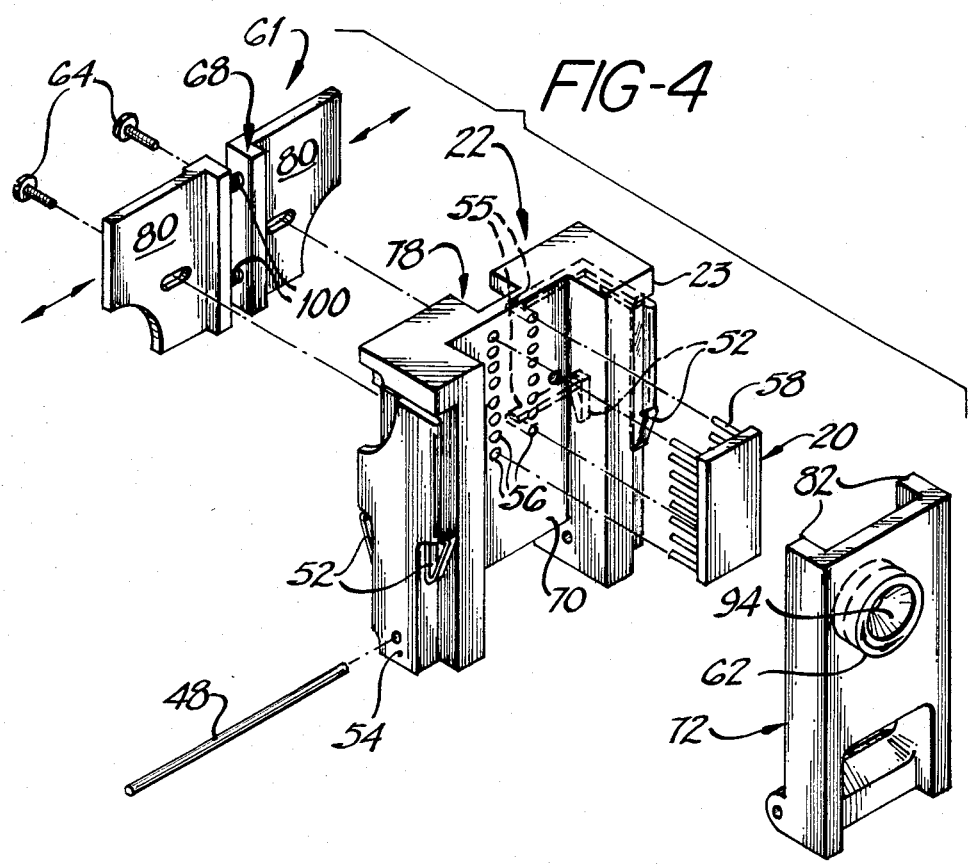
FIG. 4 is an exploded perspective of the holder for the circuit board.
Figures 5, 6:
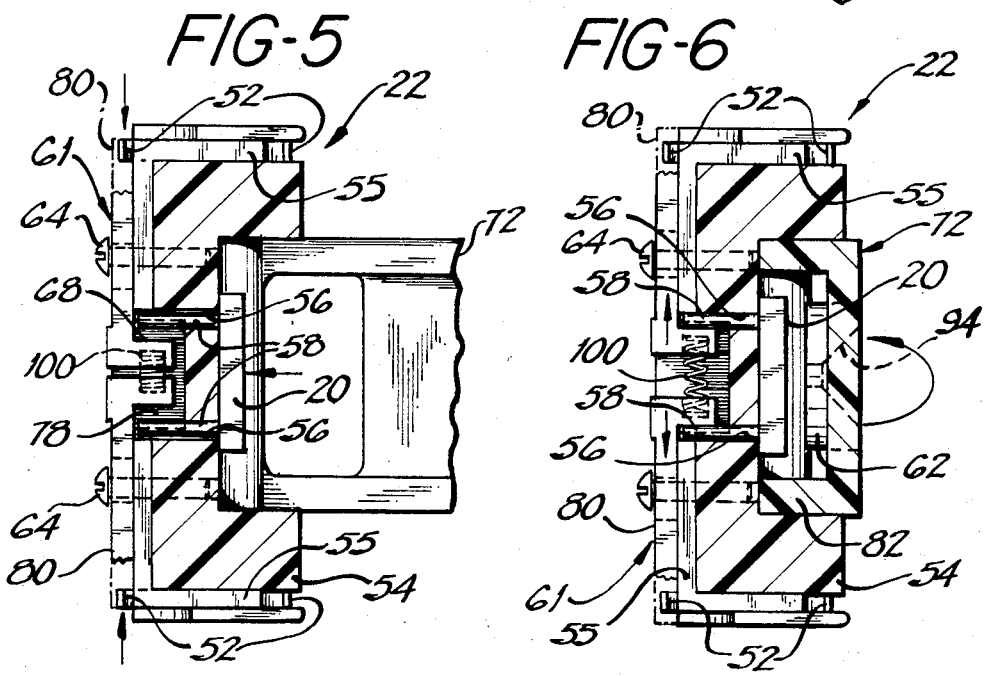
FIG. 5 is a partial sectional view of the holder in the open position.
FIG. 6 is a partial elevational view of the holder in the closed position.

The crystal holder assembly (22) is illustrated clearly in FIGS. 4–6. The holder is comprised of an insulated block (54). Pivoted from the bottom of block (54), one one side of the block on pivot rod (48), is a mask holder (72). Vertically aligned inwardly facing flanges (82) act as stops to prevent overswinging of the mask holder (72) and preventing the contacting of the circuit board (20) by the mask holder (72). A longitudinal channel (70) is provided on the same side of the insulated block (54), as the mask holder (72), and includes plug-in means for inserting a circuit board therein. The plug-in means are shown as a plurality of mating receptacles (56) for the prongs (58) of the circuit board (20).

The other side of the insulated block (54) is provided with a second elongated channel (78) into which the prongs (58) of the circuit board project and make contact with leads (55) which are relatively thick bars of conductive material positioned in grooves in the sides and back of the holder as shown in FIGS. 4, 5 and 6. Leads (55) connect to leads (52) which are also held in grooves in block (54) and which are much thinner and made of a conductive material having some resiliency such as a copper strip. The ends of leads (52) are bent to form curled fingers which extend away from block (54), and make brushing contact with connector pins (50) of leads (38). The curled finger configuration combined with the resilience of the contact (52) insures that excellent contact is made with the contact pins (50). As the block is lowered, the curled fingers of contacts (52) will touch the pins (50) and will then be forced inward toward the block as it is further lowered into the chamber. Therefore, the spring forces of the contacts (52) hold them against pins (50).

Holder (22) will be lowered into the chamber until a lip (23) at the top of the holder engages the top of the chamber. Maintained in elongated channel (78) is a holding means (61) which is comprised of two plates (80) outwardly spring biased by springs (100) having channels (68) thereon which press against prongs (58) to securely maintain the circuit board (20) in the holder (53). The holding means is secured to block (54) by two screws (64).

As shown in FIG. 4, there can be as many as four curved finger contacts (52) and associated connection (55) in each holder to contact up to four separate pins (58) from the circuit board (20). As shown in FIG. 4, positioned in mask holder (72) is circular mask (62). This mask is shown in FIGS. 4, 6, and 7, wherein a tapered nozzle (94) is eccentrically formed to permit adjustment thereof to align the nozzle (94) relative to the crystal in the circuit board (20) by turning the nozzle (94) (arrows in FIG. 4). This mask is preferably used for final plating of the crystal in the circuit board (20). The mask is made from a relatively pliable plastic material which can be easily press-fit and removed as needed and replaced by other masks with different configurations as needed.

The circuit board (20) will have its prongs (58) plugged into receptacle (56) when the mask holder (72) is in the open position, as shown for example in FIG. 5. The holding means (61) is then placed in the second elongated channel (78) by squeezing the spring biased plates (80) together and abutting the channels (68) against the prongs (58) projecting from the other side of the receptacle (56). The mask holder (72) is then closed by having the inwardly facing flanges (82) abut against channel (70). This presents a narrow profile for insertion within the slot (24) of the base (26), as shown in FIG. 1. As shown in FIG. 7, the contact surfaces (52) will electrically engage lead pins (50) so that when the oscillator is activated, the circuit will be completed and the crystal in the circuit board (20) will oscillate to enable the plating process to proceed.

Figure 2:
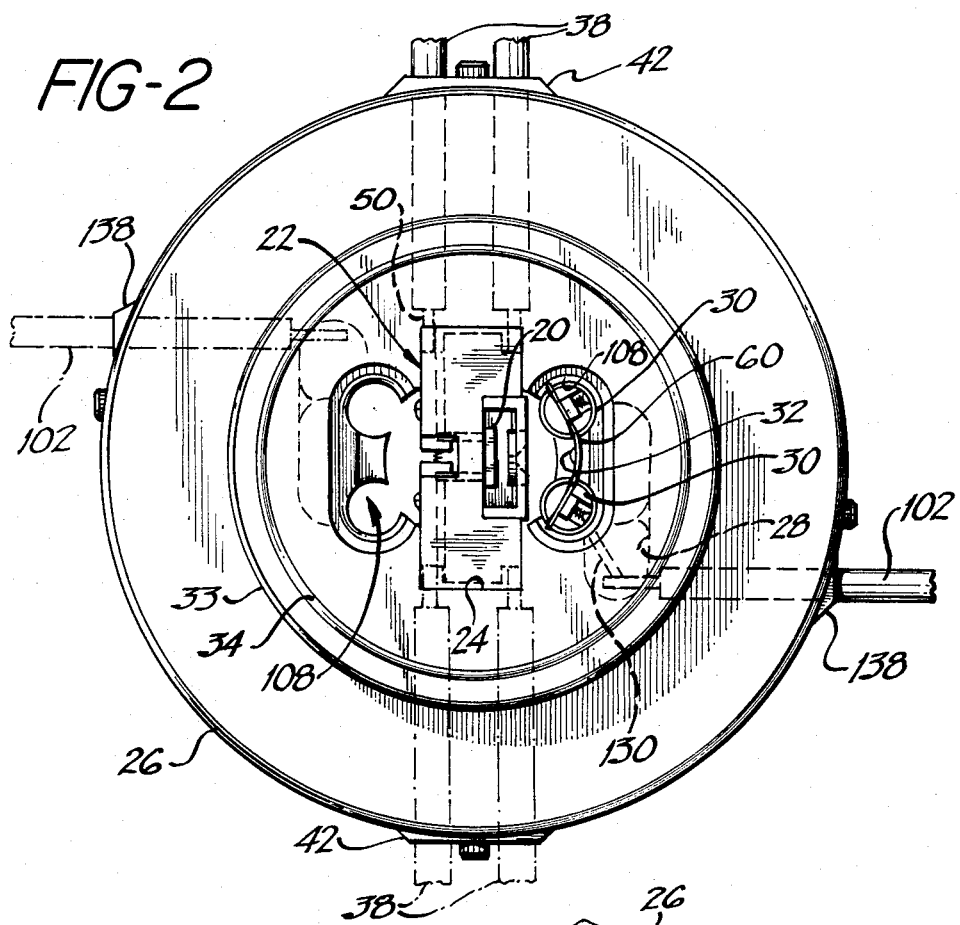
FIG. 2 is a top plan view of the crystal plating device taken along line 202 of FIG. 1.

Referring to FIGS. 1–3, and 7, the slot (24) is formed in chamber (28) along a line parallel to shielded wires (38). Inwardly from the ends of slot (24) and on opposite facing sides thereof are two pairs of clover leaf apertures (108), one aperture of each pair being sized to receive an insulating sleeve (110) which fits around the filament post (30) and insulates it from the base (26). The second filament post (30), of each pair, is slidingly disposed within a smaller diameter opening to be grounded to the base (26). In the embodiment depicted only one pair of posts (30) is utilized. Although, as shown in FIG. 2, power may be supplied to both pairs of posts by leads (102) and the holder (22) oriented in opposite directions.

The chamber (28) extends top to bottom of the base (26) and includes the clover leaf appertures (108) in communication with the slots (30).

Referring to FIGS. 1, 3, 7, and 8, the filament post (30) is part of a filament post assembly (112) which may include the insulating sleeve (110) and the filament (60) and insulated filament post holder (114) having a horizontal mounting flange (116) to which a mounting screw (118) passes to be threadedly received in a tapered hole in the base (26). This is shown in FIGS. 1 and 3. There is one holder (114) for each pair of posts (30) is cut out of the chamber (28) in a contour to aid evacuation of the chamber.

The holder (114) has two vertical holes (124) central thereto through which threaded member (118) extends to receive a mounting nut (128) holding connecting lead (130) to member (118). The strip (130) extends between the post (30) to leads (102).

Referring to FIGS. 1, and 3, the first of the posts (30) is connected to lead (130) which is in turn connected to external power supply lead (102) that extends through a metal sleeve and is sealed at its inner end by an "O" ring (not shown) to prevent an air lead to the vacuum chamber 28. Referring to FIG. 1, a retainer (138) having bifurcated end, positions the wire (102) within the sleeve and sealingly holds the sleeve within the feedthrough bore (132) through the base (26). The retainer (138) is held in position by a threaded fastener (140).

Figure 8:
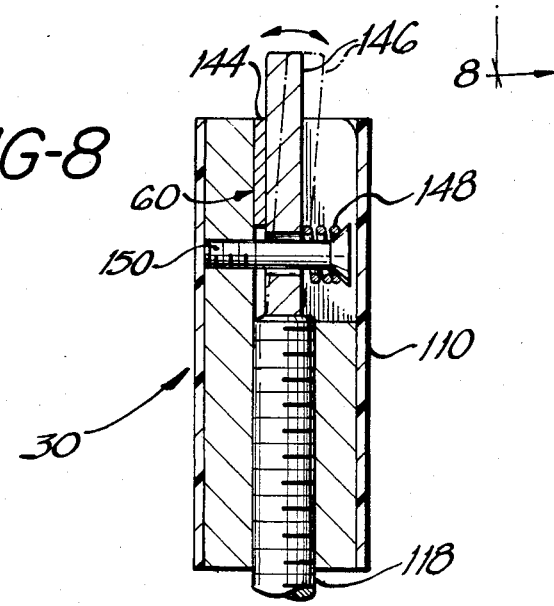
FIG. 8 is a sectional view of a filament post taken along line 8—8 of FIG. 7.

Referring to FIGS. 7 and 8, the filament post (30) is provided with a body (142) which is hollow and threadedly mounted on member (118). The body (142) is provided with slot (144) at its upper end. a lever (146) is biased sidewardly by a spring (148) entrapped therein by screw member (150). Spring (148) will normally urge lever (146) sidewardly so that the slot (144) is readily accessible by urging the spring in the opposite direction (FIG. 8 arrows).

Referring to FIG. 8, the insulated sleeve (110) has a cut out which uncovers the slot (144) of adjacent facing filament posts so that whenever a filament (60) is to be connected the operator presses the lever (146) so that the end of the filament can be inserted in the slot (144). Releasing the lever (146) allows the spring (148) to force the lever (146) sidewardly to entrap the filament (60) end within the slot (144) and securely wedge it in the slot (144). Thus, the metal filaments (60) are easily and securely fastened between adjacent pairs of posts (30). The height of the posts (30) is set to correspond to the circuit board size and location of the crystal and the opening in the mask (88).

Referring to FIGS. 3 and 7, the power circuit is provided with a power lead (102) which is connected to a suitable source of power, making a circuit from lead (130) to post (30) to filament (60) to uninsulated post (30) which is grounded to the base (26) so as to complete the circuit. When the power source is energized, after the holder (22) is assembled in the base (26) and a vacuum established in the chamber (28), the electrical current will heat the filament (60) and cause the noble metal to be vaporized and the nozzle (94) of mask (88) will direct the vaporized metal to be deposited upon the oscillating crystal in the circuit board (20) which is controlled by the oscillating circuit previously described.

Prior to performing plating operations, the chamber is thoroughly cleaned. This is accomplished by disconnecting the internal power supply leads (102), removing the pairs of filament posts (30). The chamber and the posts can be cleaned by any cleaning implement, as for example a small brush. After cleaning, the apparatus is reassembled and connected to the power supply and the external oscillator if necessary, or the frequency counter. A filament, having thereon a noble metal, e.g., silver or gold, is then placed in and connecting adjacent the filament holders to complete the electrical circuit.

The chamber is then connected to an appropriate source of vacuum by placing the chamber on top of a vacuum manifold, so that the vacuum can be drawn from the bottom of the chamber. A circuit board containing a crystal to be plated is mounted within the holder (22) in preparation for plating. Wide ranges of circuit board sizes can be accommodated in the chamber for the different dimensions of the circuit boards and still bring the crystals into proper location for plating.

One or more holders (22) can be used in the plating process. Preferably, several holders will be used to insure that the vacuum chamber will not be idle while circuit boards are being mounted remotely of the chamber in holders for plating.

After the circuit board is placed in the holder, the cover of the holder is brought into upright position, bringing the mask into operative position with the face of the crystal in the circuit board. The mask is manipulated to the position that will deposit the material in the desired location of crystal in the circuit board.

By rotating the mask, it is possible to adjust the horizontal vertical position of the eccentrically positioned orifice in the mask with respect to the face of the crystal. As mentioned, different mask configurations can be used with the same holder.

The crystal holder (22) is then placed in the slot (24) of chamber (28) so that the contact surfaces (52) of the holder will make electrical contact with the lead pin (50) from the external oscillator lead or frequency meter or power supply network to the internal oscillator, if one is used. The cover of the chamber is then put in place and is sealed automatically as the vacuum is drawn from the bottom of the container.

When an internal oscillator is used, power is provided to the oscillator to which the crystal in the circuit board is connected and incorporated. The frequency of the oscillator is accurately measured by a frequency meter to which the oscillator is externally connected. Plating of the crystal in the circuit board can be started once the crystal begins oscillating. Plating is commenced by connecting the power supply to the filament by an appropriate switch which has not been shown. The head in the filament combined with the vacuum in the chamber vaporizes the silver or gold on the filament and as the vaporization proceeds, particles of the vaporized material are deposited and condense on the unmasked portion of the crystal. The frequency of the crystal will change as the buildup of the condensed material continues on the crystal. When the frequency counter indicates that the desired frequency is reached, the power to the filament is discontinued. Because of the relatively small size of the filament as compared to the filament holder, and adjacent mass of the chamber, the heat will be rapidly drawn away from the filaments, cooling them sufficiently to quickly and vaporization of the plating material. After plating has been completed, the vacuum is released and the circuit board holder is removed and another holder is inserted for the next plating operation.

The ribbons containing plating material are easily positioned for plating in the filament posts as shown in FIG. 7. The filament is ribbon shaped and formed of a relatively thin strip of electrically conductive and resistive material, such as tantalum, molybdenum, tungsten, etc., which will heat upon application of current as previously described. The filament has been stretched or dimpled at an approximate mid-point location.

The dimple acts as collecting reservoir for a candy can shaped sliver of precious metal or other plating material which is placed on the upper edge of the filaments and melts into a ball which "wets" into the dimple under the influence of surface tension, when power is initially applied to the filament.

Many plating cycles can be completed without exhausting the ball of plating material that has been formed in the dimple. The ball can be replenished by merely placing additional slivers of plating material as needed on the top of the filament. After numberous slivers have been consumed, the filaments will deteriorate and break. The filaments can be easily replaced by merely pivoting the top of spring loaded lever (146) and inserting the new filament in slot (60).

It should be noted that (150) coacts with spring (148) to adjust the tension of lever (146) against filament (144). This tension is important because it provides the contact pressure for proper conductivity and at the same time should not be a source of excessive shearing pressure against the heated filaments, which produces premature failure.

It should also be noted that the filament post described will accommodate less efficient straight wire filaments or a wide variety of other filament shapes and sizes.

It should be noted that the interchangeability of masks and/or holders allows for the plating of different size circuit boards in the same chamber without modifying the chamber in any way to accommodate the different size circuit boards. Also, because the different masks can be used interchangeably, it is convenient to separately perform either base coating or final calibration coating procedures in the same chamber. Further, if desired, because of the superior qualities of this apparatus, it is possible to conduct both base and final calibration procedures during a single operation in the apparatus when coating crystals without their accompanying circuits. The single or one step procedure is used when the final product does not require the intermediate processing steps often employed to insure compliance with more stringent crystal performance specifications.

From the above discussion it is clear that there are many advantages of the present apparatus. For example, the vacuum chamber (28) is of relatively small volume and is relatively uncomplicated in shape, and has never been utilized in conjunction with the plating of a clock oscillator circuit board. By using the removable circuit board holder to mount the circuit board, all circuit board adjustments can be made in places remote from the vacuum chamber where there is adequate working room and where the process of adjusting the circuit board in the holder will not interfere with the plating operation. After the plating has produced the build up of the plating material on the walls of the chamber, the unused plating material can be easily removed and recaptured by the ease of cleaning the plating chamber.

The relative small volume of the vacuum chamber combined with the use of the holder to hold and adjust the circuit board prior to plating insures that the actual cycle time for performing the plating in each of the circuit boards is relatively short. Additionally, almost all of the valuable plating material can be recaptured without difficulty by the simple cleaning process mentioned previously.

The purpose of the holding means (61), which is spring loaded, is to hold the prongs from the circuit board against the contacts to insure optimum electrical continuity between the leads (55) and the prongs of the board so as to power the crystal circuit and thereby oscillate it during the coating process so that it can be coded to the exact and precise point that the frequency desired will be produced by the mask on the crystal. This is done by having the two plates (80) which are resiliently urged apart by means of the two small springs (100), placed in tracks behind or in the back of the mask body. Dog-legs extending into the groove in the back of the mask can be compressed or squeezed together when the board is inserted into the corresponding receptacle to hold the board. The tension on the end of the springs is then relieved and the plates urged apart, the dog-legs, therefore, pressing all of the prongs extending from the chip to hold them fast against the sides of the back receptor to which the leads are connected.

It will be understood that the various changes in the details, materials, arrangement of parts and operating conditions which have been herein described and illustrated in order to explain the nature of the invention may be made by those skilled in the art within the principles and scope of the invention.

What is claimed is:

1. A crystal plating device comprising:
  (a) a base having a power circuit and means for an oscillating circuit therein;
  (b) a chamber formed in the base;
  (c) a sealed top enclosing the chamber;
  (d) at least one pair of filament posts affixed to the base disposed within the chamber and in the power circuit;
  (e) at least one of said filament post comprises a hollow body having an insulating sleeve thereon and threadedly received on a member affixed to the base, a slot in the body near the upper end and a spring biased pivotable lever, the filament disposed within the slot, whereby pivoting the lever will permit the selective engagement and disengagement of the filament in the slot;
  (f) a filament connected across the filament posts, wherein the filament posts are positioned in the chamber adjacent the crystal to provide effective plating of the crystal;
  (g) a crystal holder adapted to releasably support a crystal removably connected with the base;
  (h) a crystal in the oscillating circuit and carried by the crystal holder; and
  (i) said chamber adapted to be connected to a pump to vacuum pump the chamber, whereby energizing the circuits will oscillate the crystal and evaporate the filament to plate the crystal and produce the desired frequency therefore.

2. A crystal plating device having:
  (a) a base having a power circuit and means for an oscillating circuit therein;
  (b) a chamber formed in the base;
  (c) a sealed top enclosing the chamber;
  (d) at least one pair of filament posts affixed to the base disposed within the chamber and in the power circuit;
  (e) a filament connected across the filament posts, wherein the filament posts are positioned in the chamber adjacent the crystal provide effective plating of the crystal;
  (f) a crystal holder adapted to releasably support a crystal removably connected with the base;

(g) a crystal in the oscillating circuit and carried by the crystal holder; and (h) said chamber adapted to be connected to a pump connected to the base to vacuum pump the chamber, whereby energizing the circuits will oscillate the crystal and evaporate the filament to plate the crystal and produce the desired frequency therefore; wherein the filament post comprises a hollow body having an insulating sleeve thereon and threadedly received on a member affixed to the base, a slot formed in the body near the upper end and a spring biased pivotable lever, the filament disposed within the slot, whereby pivoting the lever will permit selective engagement and disengagement of the filament in the slot.

3. The plating device of claim 1, or 2, wherein said means for an oscillating circuit in said base comprise at least one contact pin extending through said base into said chamber.

4. The plating device of claim 3 wherein said contact pin is constructed and arranged to be in resilient contact with said oscillating circuit.

5. A filament post for holding a filament in a crystal plating device comprising:

(a) a member affixed in the plating device and in a power circuit;

(b) a hollow body having an insulating sleeve thereon and threadedly received on the member;

(c) a slot in the body near the upper end and a spring biased pivotable lever, whereby pivoting the lever will permit selective engagement and disengagement of the filament in the slot, wherein the filament posts are positioned in the plating device adjacent the crystal to provide effective plating of the crystal.

6. A crystal plating device comprising:

a base having a passage extending from one end of said base to the other;

one end of said base with said passage adapted to be connected to a source of vacuum;

a cap adapted to coact with the other end of said base with said passage to seal said other end of said base, and with a source of vacuum seal said passage to form a sealed chamber within said base;

means for oscillating a crystal in said base extending into said chamber;

said chamber adapted to receive a crystal holder adapted to releasably support a crystal in operative contact with said means for oscillating a crystal;

at least two filament posts mounted in said chamber disposed to hold a filament in operative relation to said crystal holder, wherein the filament posts are positioned adjacent the crystal to provide effective plating of the crystal;

at least one of said filament posts comprising:

positioning means adapted to receive a conductive ribbon and operatively position said ribbon with respect to said crystal holder;

resilient means to selectively urge engagement or disengagement of such filament into electrical conductivity with a power circuit;

a power circuit extending into said chamber and connected to said filament post so that actuation of said power circuit will cause power to pass through said filament post to a filament positioned in the post to vaporize plating material or the filament.

7. The plating device of claim 6 wherein:

at least one of said filament posts has a free end and;

said positioning means comprises:

a slot extending across said filament post and extending from the free end inwardly along the length of said filament post;

means allowing rotation of said slot to position said slot with relation to said chamber;

stop means to limit the travel of said lever.

8. The plating device of claim 7 wherein said resilient means to urge said filament into electrical conductivity with said power circuit comprise:

a flat surface on said filament post;

a lever pivotably connected to said filament post;

resilient means to resiliently urge said lever against said flat surface on said filament post.

9. The plating device of claim 8 wherein one of said filament posts comprise::

a conductive core;

a conductive threaded member threaded into said conductive core;

an insulating sleeve disposed about said said conductive core;

a flat surface formed at one end of said conductive core;

slot means formed in said insulating sleeve;

said insulating sleeve extending around said lever means and the slot thereon disposed in registration with the flat surface of said insulating core;

said insulating sleeve in register and serving as a stop means to limit the travel of said lever.

* * * * *